(12) United States Patent
Laven et al.

(10) Patent No.: US 10,622,268 B2
(45) Date of Patent: Apr. 14, 2020

(54) APPARATUS AND METHOD FOR ION IMPLANTATION

(71) Applicant: Infineon Technologies AG, Neubiberg (DE)

(72) Inventors: Johannes Georg Laven, Taufkirchen (DE); Moriz Jelinek, Villach (AT); Werner Schustereder, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/962,835

(22) Filed: Dec. 8, 2015

(65) Prior Publication Data

US 2017/0162459 A1   Jun. 8, 2017

(51) Int. Cl.
| | |
|---|---|
| *H01L 21/66* | (2006.01) |
| *H01J 37/244* | (2006.01) |
| *H01J 37/317* | (2006.01) |
| *H01L 21/265* | (2006.01) |
| *H01L 21/67* | (2006.01) |
| *H01L 21/683* | (2006.01) |

(52) U.S. Cl.
CPC .......... *H01L 22/26* (2013.01); *H01J 37/244* (2013.01); *H01J 37/3171* (2013.01); *H01L 21/265* (2013.01); *H01L 21/67109* (2013.01); *H01L 21/67115* (2013.01); *H01L 21/67248* (2013.01); *H01L 21/6835* (2013.01); *H01J 2237/2001* (2013.01); *H01J 2237/31703* (2013.01)

(58) Field of Classification Search
CPC . H01L 22/26; H01L 21/265; H01L 21/67115; H01L 21/67109; H01L 21/6835; H01L 21/67248; H01L 22/10; H01L 22/20; H01L 438/05; H01L 438/14; H01L 22/00; H01J 37/244; H01J 37/3171; H01S 5/0014; G01B 2210/56
See application file for complete search history.

(56) References Cited

U.S. PATENT DOCUMENTS

| | | | |
|---|---|---|---|
| 5,840,592 A * | 11/1998 | Russell | ............. H01L 27/14806 438/795 |
| 7,800,081 B2 | 9/2010 | Moffatt et al. | |
| 9,373,512 B2 | 6/2016 | Breil | |
| 2003/0196996 A1 * | 10/2003 | Jennings | ............... B23K 26/032 219/121.73 |
| 2008/0188011 A1 * | 8/2008 | Henley | .................. B28D 1/221 438/5 |
| 2010/0210041 A1 | 8/2010 | Chang et al. | |

(Continued)

FOREIGN PATENT DOCUMENTS

| | | |
|---|---|---|
| CN | 1222016 C | 10/2005 |
| CN | 101471238 A | 7/2009 |

(Continued)

*Primary Examiner* — Moazzam Hossain
*Assistant Examiner* — Stanetta D Isaac
(74) *Attorney, Agent, or Firm* — Slater Matsil, LLP

(57) ABSTRACT

An apparatus and a method for implanting ions are disclosed. In an embodiment, the apparatus includes a receptacle configured to support the wafer, a source of dopants configured to selectively provide dopants to an implantation region of the wafer and a source of radiation configured to selectively irradiate the implantation region.

20 Claims, 3 Drawing Sheets

(56) References Cited

U.S. PATENT DOCUMENTS

| | | | |
|---|---|---|---|
| 2011/0295539 A1* | 12/2011 | Tsai | H01L 21/67248 |
| | | | 702/99 |
| 2014/0073145 A1* | 3/2014 | Moffatt | B23K 26/0626 |
| | | | 438/795 |
| 2015/0155172 A1* | 6/2015 | Breil | H01L 21/268 |
| | | | 438/530 |
| 2015/0289316 A1* | 10/2015 | Shimizu | H05B 6/6447 |
| | | | 438/795 |
| 2016/0260612 A1* | 9/2016 | Price | G01B 11/0683 |

FOREIGN PATENT DOCUMENTS

| | | |
|---|---|---|
| CN | 104681419 A | 6/2015 |
| WO | 0171787 A1 | 9/2001 |

\* cited by examiner

APPARATUS AND METHOD FOR ION IMPLANTATION

TECHNICAL FIELD

The present disclosure relates to manufacturing of semiconductor devices and, more particularly, to ion implantation on a wafer for manufacturing semiconductor devices.

BACKGROUND

In manufacturing semiconductor devices on a wafer, a temperature of the wafer influences acceptance and/or annealing of atoms and/or ions used in ion implantation to form doping agents.

Conventionally, a chuck that supports the wafer during ion implantation is cooled in order to remove thermal energy induced by the impinging ions. However, there are some applications that require a heated chuck in order to establish a certain wafer temperature during processing. Chuck heating can induce undesired mechanical stress to the wafer though. In addition, further wafer heating may need to be limited to temperatures sufficiently low not to endanger a stability of structures formed on the wafer in previous manufacturing steps. An implementation of an ion implantation requiring elevated wafer temperature can even be precluded from some processes. For example, a thin wafer glued to a glass carrier might be barred from the aforedescribed ion implantation technique. Using a chuck as a source of heat, the heat would need to propagate through the glass carrier, a glue layer, a structure layer if present, a substrate layer, and a presently processed structure layer that faces the ion source, before reaching the portion of material that is to accept dopants from the ion source. However, since a typical glue layer must not be exposed to temperatures typical in conventional ion implantation, such ion implantation cannot be used.

It may be desirable to provide an apparatus for use in manufacturing semiconductor devices that improves on conventional apparatus.

It might also be desirable to provide a method of ion implantation for use in manufacturing semiconductor devices that improves on conventional methods.

SUMMARY

In accordance with embodiments of the present invention, there is provided an apparatus comprising a receptacle configured to support a wafer, a source of dopants configured to selectively provide dopants to an implantation region of the wafer, and a source of radiation configured to selectively irradiate the implantation region. In an aspect, a method as defined in the independent method claim is provided. In other aspects, apparatus as defined in the independent apparatus claims are provided. The dependent claims define embodiments according to the disclosure in one or more aspects. It is to be noted that features of these embodiments may be combined with each other unless specifically noted to the contrary. For example, features of an embodiment of the apparatus may be used to perform steps of an embodiment of the method.

This summary is submitted with the understanding that it will not be used to interpret or limit the scope or meaning of the claims. This summary is not intended to identify key features or essential features of the claimed subject matter, nor is it intended to be used as an aid in determining the scope of the claimed subject matter.

Other methods, apparatus and systems are also disclosed. Those skilled in the art will recognize additional features and advantages upon reading the following detailed description, and upon viewing the accompanying drawings.

BRIEF DESCRIPTION OF THE DRAWINGS

A complete understanding of the present disclosure may be obtained by reference to the accompanying drawings, when considered in conjunction with the subsequent, detailed description, in which.

For purposes of clarity and brevity, like elements and components will bear the same designations and numbering throughout the figures.

DETAILED DESCRIPTION OF ILLUSTRATIVE EMBODIMENTS

Figure 1:
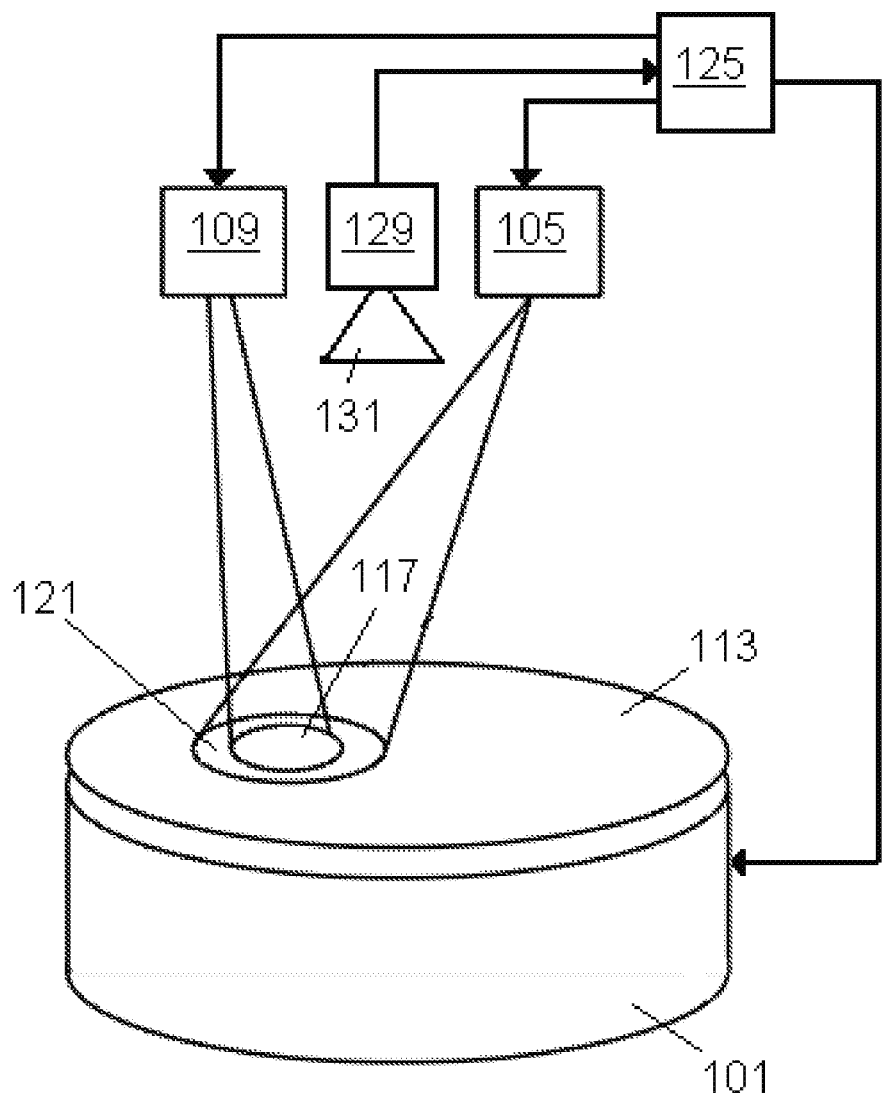
FIG. 1 is a front perspective view of an embodiment according to the disclosure in a first aspect.

In an aspect the disclosure encompasses an apparatus for ion implantation in a wafer. FIG. 1 is a front perspective view of an embodiment according to the disclosure in a first aspect. The apparatus comprises a receptacle 101 configured to support the wafer. In some embodiments, as shown in FIG. 1, the receptacle is provided as a chuck. The apparatus comprises a source of dopants 109 that is configured to selectively provide dopants to an implantation region 117 between the receptacle 101 and the source of dopants 109. In some embodiments, the source of dopants 109 is an ion source that is configured to accelerate ions and eject an ion beam in the direction of the implantation region 117. For example, the ion source is configured to form an ion beam having a power of from 1 W to a few kW. The apparatus 100 comprises a source of radiation 105 that is configured to selectively provide radiation in the direction of the implantation region 117. In some embodiments the source of radiation 105 is configured to irradiate the wafer 113 supported by the receptacle 101 in an irradiated region 121 that encompasses the implantation region 117. While in FIG. 1 the implantation region 117 is shown to be essentially circular, the skilled person can implement the source of dopants so as to provide the dopants in a region of any other shape. Likewise, while in FIG. 1 the irradiation region 121 is shown to be essentially circular, the skilled person can implement the source of radiation so as irradiate a region of any other shape. Accordingly, in some embodiments, the implantation region extends approximately across all the wafer having a stripe shape. Likewise, in some embodiments, the irradiation region extends approximately across all the wafer having a stripe shape. In some embodiments the irradiation region completely encompasses the implantation region.

In some embodiments the source of radiation 105 is configured to emit electromagnetic waves to be absorbed by the wafer 113. In some embodiments, the source of radiation 105 is a halogen lamp, for example, emitting light having wavelengths essentially in a range from 500 nm to 10 μm. In some embodiments, the source of radiation 105 is one or more light emitting diodes, for example, emitting light having wavelengths essentially in a range from 230 nm to 760 nm. In some embodiments, the source of radiation 105 is a laser, for example, emitting light having a wavelength of one of 308 nm, 528 nm, 532 nm or 10.8 µm. At least one effect can be that a spectrum of wavelengths of the radiation emitted from the source of radiation can be controlled and/or selected to achieve a desired transport of heat to the wafer 113 in the irradiated region 121. In some embodiments, an array of light emitting diodes (not shown) is used. In some embodiments, a laser beam is used to illuminate the wafer surface laterally, whereby, for example, the irradiation region can be shaped as a stripe that extends approximately across all the wafer.

Some embodiments further comprise a control unit 125 coupled to the source of radiation 105 and configured to control the source of radiation 105. At least one effect can be that variations of process parameters that conventionally result in a variation of temperature laterally across the wafer 113 and/or vertically inside the wafer 113 can be compensated by a dynamic control of the radiation incident on the wafer 113. In some embodiments, the control unit 125 is coupled to a drive unit (not shown) of the receptacle 101 and/or a drive unit (not shown) of the source of radiation 105. The control unit 125, in some embodiments, is configured to direct a relative motion of the source of radiation 105 relative to a surface of the wafer 113 that is in the implantation region 117 so as to scan the surface of the wafer 113 with a beam of radiation such as a beam of light.

In some embodiments the control unit 125 is configured to control the source of radiation 105 so as to provide a certain amount of energy to be absorbed by the wafer 113 in the implantation region 117. At least one effect can be that that the radiation can provide energy to the wafer 113 in the implantation region 117 in addition to energy provided by dopants that reach the implantation region 117.

Some embodiments further comprise a detector 129 configured to detect a surface temperature of the wafer 113 in the implantation region 117. In some embodiments, the detector comprises a lens 131 and a sensor element (not shown) that is configured to receive light emitted from the surface of the wafer 113. At least one effect can be that, based on a spectrum of the received electromagnetic radiation, a surface temperature of the wafer 113 can be derived. Based on the surface temperature, a body temperature of the wafer can be derived, in particular, when a specific heat capacity of the wafer material and/or a temperature at a backside of the wafer is taken into account, for example, where measured or where provided by exposure to a coolant reservoir.

In some embodiments, the control unit 125 is configured to control the source of radiation 109 based on the temperature detected as a surface temperature of the wafer 113, in particular the surface temperature in the implantation region 117. At least one effect can be that an overheating of the wafer 113 can be avoided where the surface, while being exposed to radiation from the source of radiation 105 and/or dopants from the source of dopants 109, exceeds a predetermined temperature.

In some embodiments, the control unit 125 is configured to control the source of radiation 105 so as to provide the certain amount of energy during a predetermined duration. At least one effect can be that an amount of heat provided to the wafer 113 can be selected sufficiently low to avoid undue stress on a structure, for example, a semiconductor device structure, formed in and/or on the wafer, in particular in the implantation region 117. Thereby a risk of damaging the wafer 113, in particular semiconductor devices formed on the wafer 113, due to too much heat can be reduced.

In some embodiments, the control unit 125 is configured to control the source of radiation 105 based on a specific heat capacity of material of the wafer 113 in the implantation region. In some embodiments, the control unit 125 is configured to control the source of radiation 105 so as to provide the radiation in the direction of the implantation region 117 while the source of dopants 109 provides the dopants to the implantation region 117. At least one effect can be that an amount of energy imparted on the wafer 113 in the implantation region 117 can be composed of heat from the radiation plus of kinetic energy and/or thermal energy transported by the dopants from the source of dopants 109.

In some embodiments, the receptacle 101 is configured to cool the wafer. For example, where the receptacle 101 is provided as a chuck, a cooling system can be integrated with the chuck and thus be configured to cool the wafer, that is in particular, a backside of the wafer that faces the chuck, while heat is provided to a frontside of the wafer that is exposed to the radiation from the source of radiation 105 and/or the dopants from the source of dopants 109. The chuck can be provided with a tube system (not shown) configured to receive a coolant. The coolant can be pumped through the tube system to provide a heat sink. At least one effect can be that heat stored in the implantation region 117 of the wafer 113 and/or, if at all separate from the implantation region 117, heat stored in the irradiation region 121 of the wafer 113, can be controlled by control of coolant flow, where the coolant transports heat away from the implantation region 117 and/or the irradiation region 121.

Figure 2:
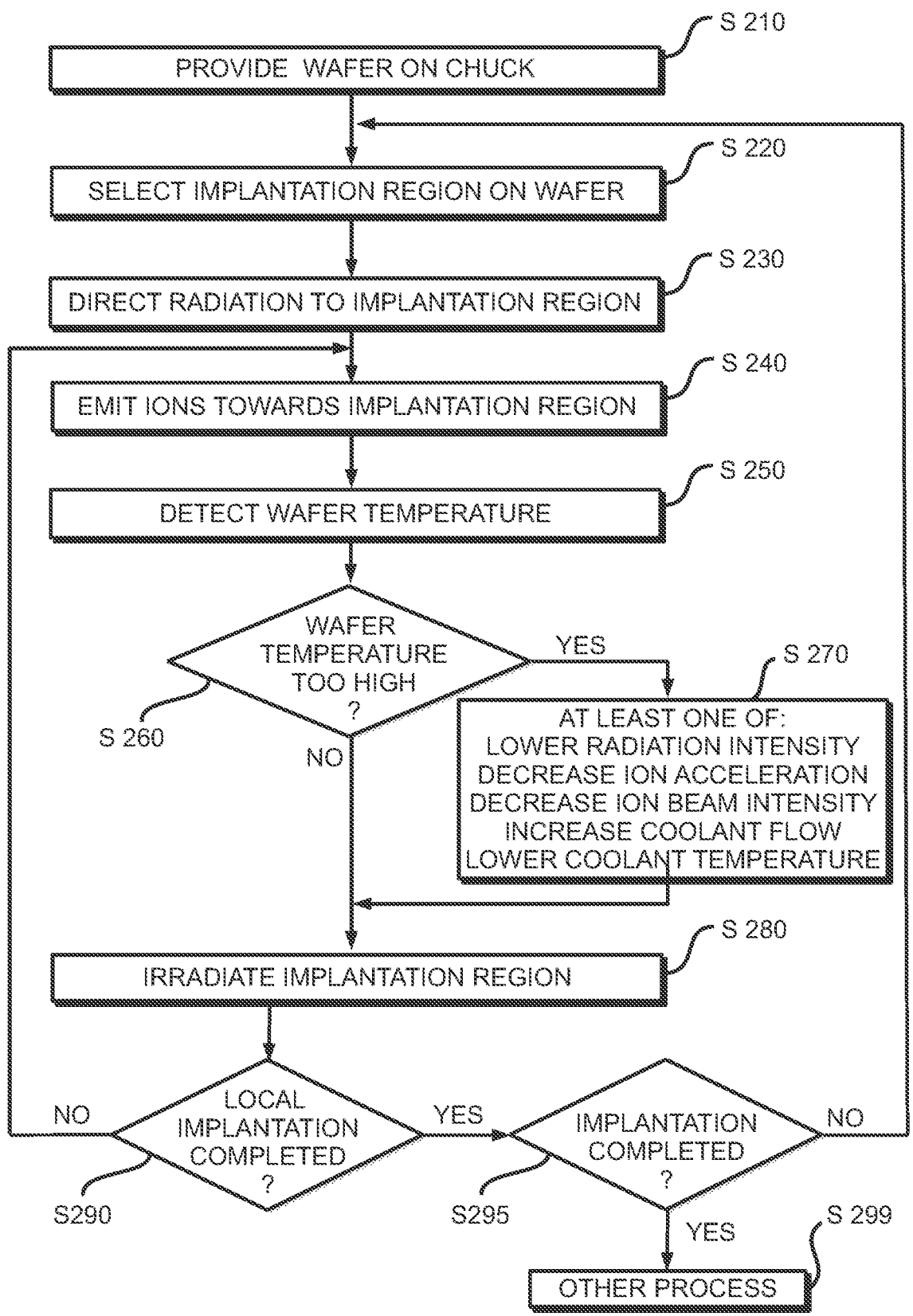
FIG. 2 is a flow chart of a method according to some embodiments.

In another aspect, the disclosure encompasses a method for ion implantation in a wafer. FIG. 2 is a flow chart of a method according to some embodiments. One or more of the acts described as follows can be implemented with the method according to some embodiments. An apparatus according to the afore-described embodiments can be used to implement the method.

At S 210, a wafer is provided on a receptacle, for example, on a chuck. In some implementations, the wafer is removably affixed to a glass carrier or any other supporting structure such as a foil carrier. For example, the wafer is glued to the glass carrier. At least one effect can be that ion implantation according to the methods herein disclosed takes place while the wafer is supported by the glass carrier plate using, for example, a layer of glue between the wafer and the glass carrier. Raising the temperature only locally and in a well-controlled way by the method described above can reduce a risk that the wafer detaches from the carrier plate to due to excessive heating along the whole wafer surface.

At S 220, an implantation region is selected where ions are to be implanted. Depending on structural requirements, for example, a dopant dose ranging from $10^{11}$ ions/cm$^2$ to $10^{18}$ ions/cm$^2$ needs to be implanted. The implantation region may have any shape as is practical. For example, where an ion source has a slit opening, the shape of the implantation region on the wafer can be essentially rectangular. The implantation surface at one time may encompass an area, for example, in a range of from 1 cm$^2$ to a few cm$^2$.

At S 230, a radiation source such as a laser, or a diode array, is provided so as to direct radiation towards the implantation region. For example, in an irradiation region of the wafer surface, an area that is irradiated at one time is in a range of from about 0.2 cm$^2$ to 2 cm$^2$. In some implementations, an irradiation region on the wafer to be irradiated by the radiation source completely covers the implantation region. In some embodiments the source of dopants and the source of radiation focus on a same point on the wafer that, at one time, is central to the implantation region. In some implementations, the irradiation region, at one time, partially covers the complete implantation region (e.g., the whole wafer) but the radiation source is made to scan across the complete implantation region in the course of time (not shown in FIG. 2).

Figure 3:
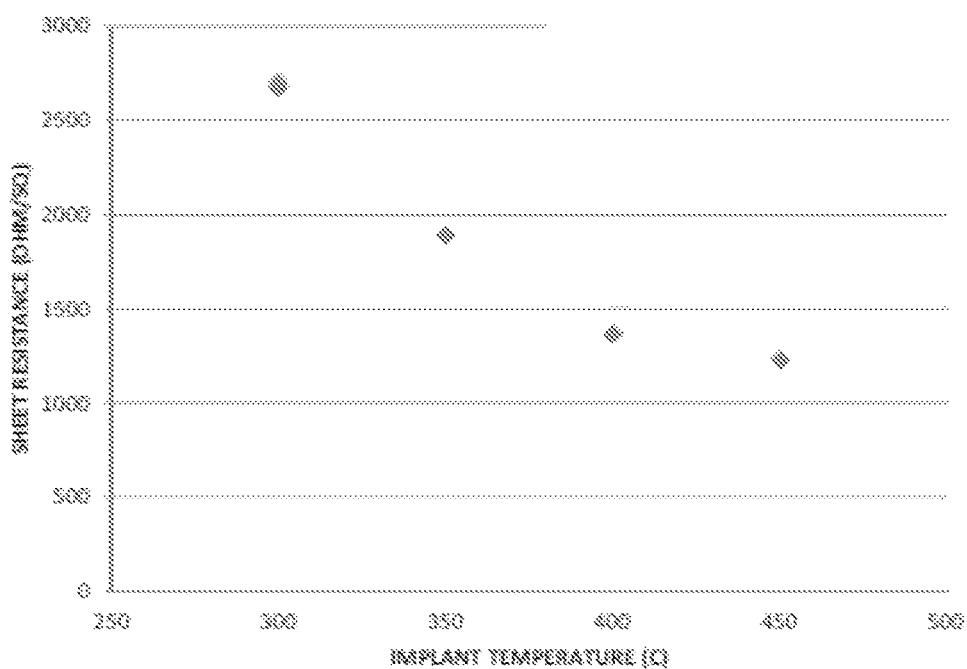
FIG. 3 is a chart that shows a relation of physical properties in an example according to some embodiments.

At S 240, dopants are selectively provided in the implantation region of the wafer. As shown in FIG. 3, a sheet resistance Rs of a doped material in the implantation region decreases as an implant temperature increases. The decrease of resistance, in some implementations, can be due to an increase in activation of ions implanted in the implantation region that is exposed to the irradiation. The inventors found that, if the implantation region is irradiated, activation of dopants can already considerably enhance despite a wafer substrate temperature of merely about T=350° C. or more, but well below a substrate temperature of about 800° C. which is conventionally required to activate the dopants. In some embodiments, the wafer substrate temperature is between about 350° C. and about 400° C. or about 350° C. and about 500° C. In other embodiments, the wafer substrate temperature is below about 400° C. or below about 500° C. At least one effect can be that, since dopants are more effectively activated, fewer dopants need to be supplied from the ion source. At least one effect can be that, since the wafer requires less heating, less energy needs to be transferred to the wafer. At least one effect may be that, since dopants are more effectively activated, a subsequent thermal process intended to activate dopants, e.g., an Rapid Thermal Processing (RTP) process may become obsolete. At least one effect can therefore be that heating can be directly applied to the face of the wafer that is exposed to the ion source thereby reducing or even avoiding a need for heating the wafer from the side of its opposite face and, by implication, all layers between both faces of the wafer. Thus, ion implantation may even become possible in some portions of manufacturing processes that are otherwise barred from ion implantation.

Some embodiments further comprise detecting a temperature of the wafer in the predetermined implantation region. At S 250, for example, using a pyrometer as a temperature detector, a temperature of the wafer is detected. Some embodiments comprise receiving electromagnetic radiation emitted from a surface of the wafer or from a structure formed on the wafer such as a metallization layer. In particular, the temperature in the irradiated region is detected. Some embodiments comprise basing the detecting of the temperature of the wafer on a signal derived from the received electromagnetic radiation. In some implementations, where the wafer is essentially transparent to the heat radiation, the temperature of the wafer is detected based on detection of a temperature of the chuck that supports the wafer. For example, the pyrometer uses detection of a radiation having a wavelength in a range of from 7 to 14 µm.

At S 260, a check is performed, if a predetermined threshold temperature value is exceeded or not. If the temperature of the wafer is detected to be too high, i.e., to exceed the predetermined temperature value, at S 270, one or more of the following measures can be taken in order to reduce the temperature to an acceptable value: the intensity of radiation from the source of radiation is reduced, the acceleration of ions from the ion source towards the implantation region is reduced, the number of ions emitted from the ion source in an ion beam to hit the implantation region of the wafer is reduced, an amount of coolant flow used in cooling the wafer is increased, a temperature of the coolant used to cool the wafer is reduced. Some embodiments comprise basing controlling the source of radiation on a temperature of the wafer in the implantation region. Some embodiments comprise controlling the source of radiation so as to provide the certain amount of energy during a predetermined duration. Some embodiments comprise basing the controlling the source of radiation on a specific heat capacity of the wafer in the implantation region. For example, the source of light can be configured as a laser to transfer an energy of about 10 J onto a surface of from 0.6 $cm^2$ to 4 $cm^2$ or more, for example, 2.25 $cm^2$ during a pulse duration of 200 ns. In another example, two lasers are each configured to transfer 1.8 $J/cm^2$ onto a surface of 2.5 mm by 0.1 mm, each during a pulse duration of about 500 ns. In some implementations, pulses are separated from one another by delay of from 100 ns to 1 µs. In place of or in addition to the above-recited measures, the person skilled in the art may contemplate other acts to bring down the wafer temperature in the irradiation region to an acceptable level.

At S 280, the implantation region is selectively irradiated. In some embodiments at least a portion of the radiation is absorbed by the wafer. In some embodiments, the method comprises controlling the source of radiation so as to provide a certain amount of energy to be absorbed by the wafer in the predetermined implantation region. In some embodiments, the source of radiation is controlled to selectively emit a wavelength of the radiation. At least one effect can be that a suitable wavelength can be selected for absorption of the radiation in the wafer to essentially take place down to a predetermined depth predetermined to be doped. In some embodiments the source of radiation is controlled to selectively emit radiation in a spectrum to absorbed by a layer of material below a front surface of the wafer that is exposed to the radiation. At least one effect can be that the surface layer and a layer close to the surface can be heated more than layers deeper below the surface so as to, for example, anneal and/or melt a surface portion of the wafer.

While the above description to this point lists acts as a sequence of steps, the skilled person can implement at least two acts to be performed in parallel.

The temperature of the wafer can continuously be detected, and measures to avoid an overheating of the wafer by irradiation and/or ion implantation can be continuously be taken in a continuous feedback loop. Some embodiments thus comprise controlling the source of radiation so as to provide the radiation in the direction of the implantation region while the dopants are provided to the implantation region. At least one effect can be that, in addition to the dopants provided to the implantation region, also the radiation provides energy to the wafer whereby the wafer can be heated in the implantation region as desired.

In some implementations, at S 290, it is checked if the implantation of ions in the implantation region is completed. If not, then the implantation process is continued as described above, in particular, by a continuation of ion emission towards the implantation region. A beam current can be in a range of from 1 µA (in an example where a low dose implantation is required) to 100 mA and more (in an example where a high dose implantation is required). Depending on beam current as well as required implantation dose, an implantation process can take from just a few seconds (in an example where a low dose implantation is required) up to a few hours (in an example where a high dose implantation is required). If the implantation process in the selected implantation region is completed, then, at S 295, it is checked if the process step of ion implantation in the present manufacturing process is altogether completed. If not, then the above-described ion implantation process is continued with the selection of another implantation region. If the ion implantation is altogether completed, at S 299, the manufacturing process is continued with another process. In some implementations, a next act, for example, may simply be to remove the wafer from the chuck or other receptacle.

The above-described example can be implemented in a scan method, wherein the ion beam is moved across the wafer. Thereby a homogeneously distributed or otherwise desired heat can be achieved. The radiation, for example, delivered as a beam of laser light, can be controlled to track a location of the ion beam hitting the wafer. Scanning can be controlled in one direction (x) or in two directions (x, y) that in an essentially common plane with the wafer surface are orthogonal to one another. For example, in one direction (x) the ion beam can be controlled to scan the wafer surface at a rate of up to a few kHz. At the same time, a drive unit can be controlled to drive the ion source across the wafer in the other direction (y) at a velocity of from 1 to 10 cm per second. In another embodiment, the ion beam is controlled to scan the wafer surface at a rate of up to a few kHz in both directions, x and y. In some implementations, the light beam is controlled to laterally irradiate an essentially rectangularly shaped line region across the wafer surface while the ion beam is controlled to scan the line region for implantation. In another implementation, a line array of diodes is made to illuminate the wafer. Control of the source of radiation can include pulsing, ramping, constant, stepwise or otherwise variable intensity of radiation. In some implementations, the spectrum of radiation can be controlled. By controlling a motion of the wafer relative to the source of radiation, the line region can be made to scan the wafer surface, for example, in a direction orthogonal to the line. In some implementations, the radiation is incrementally provided to the implantation region by a frequency scan of the light that repeatedly, for example, with a frequency of from 0.1 to 10 Hz, irradiates the implantation region to successively deliver an energy budget to the implantation region as needed to achieve and/or hold the desired temperature during the ion implantation. Control of the source of radiation is performed so as to allow annealing of damages introduced by the ion implantation even where the ion implantation and the irradiation of the implantation region are separated by some time interval kept sufficiently short.

Figure 4:
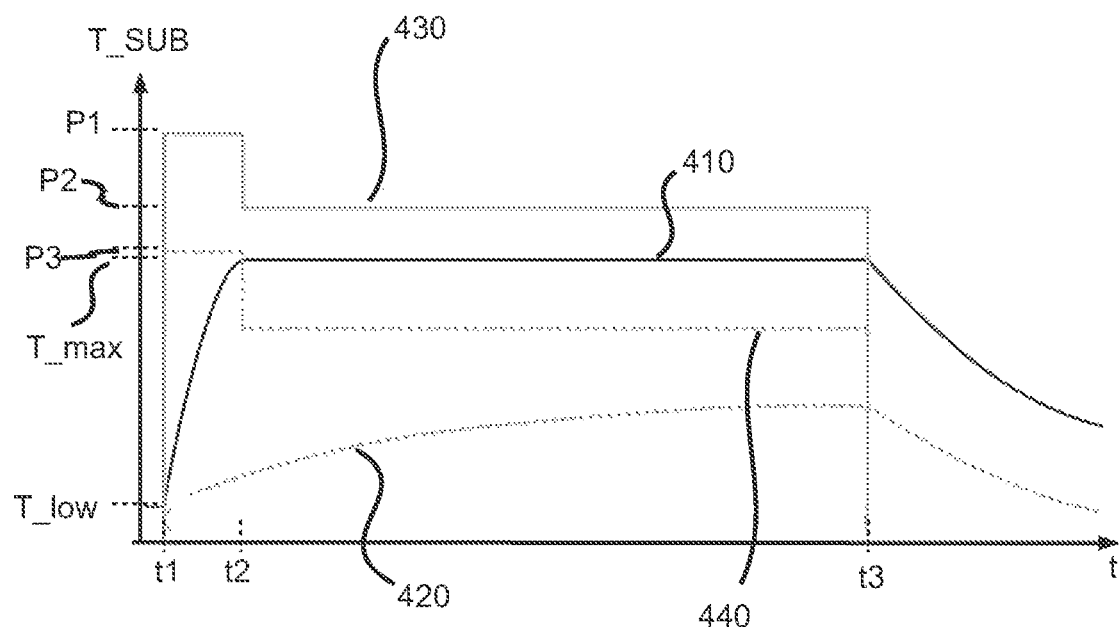
FIG. 4 is a chart that shows dynamics of physical properties in an example according to some implementations.

FIG. 4 is a chart that shows dynamics of physical properties in an example according to some implementations. More particular, temperature T_SUB of the wafer substrate in the implantation region is shown versus time t. Further, power of the source of radiation such as a light source is illustrated versus time t. A first temperature curve 410, starting from a low temperature value T_low at a time t1, when the implantation of ions in the implantation region begins, depicts a desired development of the substrate temperature during ion implantation. The temperature is desired to rise up to a maximum value T_max not to be exceeded, where, from a time t2, the temperature should stay essentially constant until, at a time t3, the ion implantation in the implantation region is completed. After the time t3, the temperature should fall. If no heating is used, as shown by a second temperature curve 420, due to kinetic and other energy imparted by ions to the wafer in the implantation region, the temperature would rise during the interval from t1 to t3; however the temperature would not rise to reach the maximum temperature T_max. Irradiating the implantation region with light as described above, from the beginning at the time t1, the desired temperature can be achieved. At first, until reaching the maximum temperature T_max, the source of radiation is controlled to radiate with a high power level P1. Once, the maximum temperature T_max is reached at t2, the radiation is reduced to a lower power level P2 below the high power level P1. Thus, sufficient power is provided to the implantation region to keep the temperature constant, i.e., to compensate loss of power, for example, due to heat radiation and other transport processes. Once, the implantation act is completed, at the time t3, the source of radiation is stopped. At least one effect can be to allow for an adaptation to variations in quality of the ion source, in particular where observed over a lifetime of the ion source. In some embodiments, for example, in a case of bad contact of the wafer on the chuck, cooling of the wafer is reduced. Accordingly, power of the source of radiation can be adaptively reduced as needed; as an example, in FIG. 4 the adaptation is illustrated by setting the source of radiation, from the start at time t1, to a lower power level P3 as opposed to power level P1 described above. In some implementations (not shown), using radiation at the higher power level P1, already prior to commencement of the ion implantation, the wafer is heated to the maximum temperature T_max. When ion implantation starts, power of the radiation is lowered from the high power level P1 to the lower power level P2.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims:

1. An apparatus for implanting ions into a wafer, the apparatus comprising:
  a receptacle configured to support the wafer;
  an ion source configured to accelerate ions selectively into the wafer thereby providing dopants in an implantation region of the wafer;
  a source of radiation configured to selectively irradiate the implantation region at a time the ion source accelerates the ions into the wafer; and
  a detector configured to detect a surface temperature of the wafer in the implantation region, wherein the detector is configured to receive electromagnetic radiation emitted from a surface of the wafer caused by the accelerated ions and the irradiation of the implantation region, and
  wherein the ion source and the source of radiation are separate from each other.

2. The apparatus of claim 1, further comprising a control unit configured to control the source of radiation so as to provide a predetermined amount of energy to be absorbed by the wafer in the implantation region.

3. The apparatus of claim 2, wherein the control unit is configured to control the source of radiation so as to provide the predetermined amount of energy during a predetermined duration.

4. The apparatus of claim 2, wherein the control unit is configured to control the source of radiation based on a specific heat capacity of the wafer in the implantation region.

5. The apparatus of claim 2, wherein the control unit is configured to control the source of radiation so as to provide radiation in a direction of the implantation region while the ion source provides the dopants to the implantation region.

6. The apparatus of claim 1, further comprising a control unit, wherein the control unit is configured to control the source of radiation based on a temperature detected as the surface temperature of the wafer in the implantation region.

7. The apparatus of claim 1, wherein the source of radiation is at least one of a halogen lamp, a light emitting diode, or a laser source.

8. The apparatus of claim 1, wherein the receptacle is configured to cool the wafer.

9. The apparatus of claim 1, wherein the source of radiation is configured to selectively irradiate the implantation region at the time the ion source accelerates the ions into the wafer so that a sheet resistance at the implantation region is achieved between about 1290 Ω/sq and about 1900 Ω/sq while a temperature of the wafer is kept at about 350° to about 500°.

10. An apparatus for implanting ions into a wafer, the apparatus comprising:
a receptacle configured to support the wafer;
an ion source configured to accelerate ions selectively into the wafer thereby providing dopants in an implantation region;
a source of radiation configured to selectively provide radiation in a direction of the implantation region at a time the ion source accelerates the ions into the wafer; and
a detector configured to detect a surface temperature of the wafer in the implantation region, wherein the detector is configured to receive electromagnetic radiation emitted from a surface of the wafer caused by the accelerated ions and the radiation of the implantation region, and
wherein the ion source and the source of radiation are separate from each other.

11. The apparatus of claim 10, further comprising a control unit configured to control the source of radiation so as to provide a predetermined amount of energy to be absorbed by the wafer in the implantation region.

12. The apparatus of claim 11, wherein the control unit is configured to control the source of radiation so as to provide the predetermined amount of energy during a predetermined duration.

13. The apparatus of claim 11, wherein the control unit is configured to control the source of radiation based on a specific heat capacity of the wafer in the implantation region.

14. The apparatus of claim 11, wherein the control unit is configured to control the source of radiation so as to provide radiation in a direction of the implantation region while the ion source provides the dopants to the implantation region.

15. The apparatus of claim 10, further comprising a control unit, wherein the control unit is configured to control the source of radiation based on a temperature detected as the surface temperature of the wafer in the implantation region.

16. The apparatus of claim 10, wherein the source of radiation is at least one of a halogen lamp, a light emitting diode, or a laser source.

17. An apparatus comprising:
a receptacle configured to support a wafer;
an ion source configured to selectively implant ions in a wafer thereby providing dopants in an implantation region of the wafer;
a source of radiation configured to selectively irradiate the implantation region at a time of implanting the ions;
a detector configured to detect a surface temperature of the wafer in the implantation region, wherein the detector is configured to receive electromagnetic radiation emitted from a surface of the wafer caused by the selectively implanted ions and the irradiation of the implantation region; and
a control unit configured to control the ion source and the source of radiation so that a temperature of the wafer based on the detected surface temperature does not exceed a predetermined temperature, and
wherein the ion source and the source of radiation are separate from each other.

18. The apparatus of claim 17, wherein the source of radiation is a halogen lamp.

19. The apparatus of claim 17, wherein the source of radiation is a light emitting diode.

20. The apparatus of claim 17, wherein the source of radiation is a laser source.

* * * * *